Figure 1:
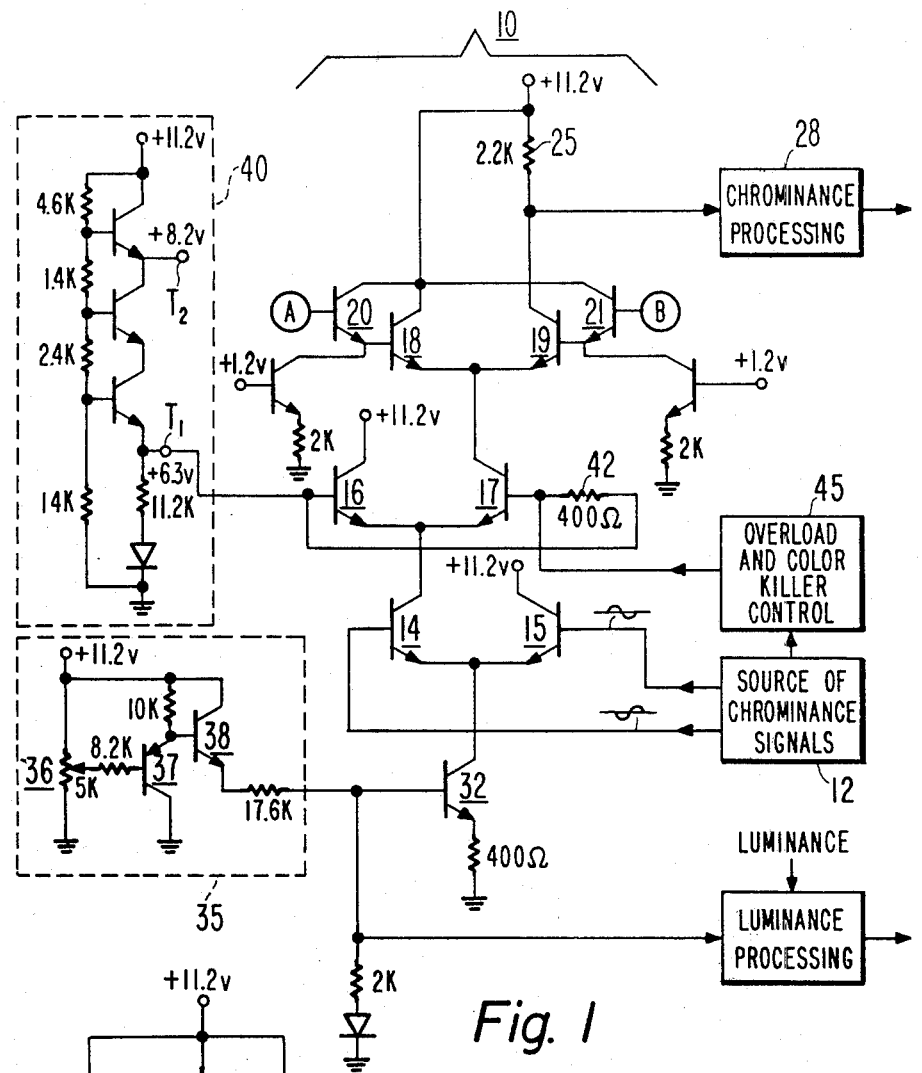

United States Patent [19]

Harwood et al.

[11] 4,318,051

[45] Mar. 2, 1982

[54] SYMMETRICALLY GAIN CONTROLLED DIFFERENTIAL AMPLIFIER

[75] Inventors: Leopold A. Harwood, Bridgewater; Erwin J. Wittmann, North Plainfield, both of N.J.

[73] Assignee: RCA Corporation, New York, N.Y.

[21] Appl. No.: 107,401

[22] Filed: Jan. 15, 1980

[51] Int. Cl.³ ............................................. H03F 3/45
[52] U.S. Cl. ................................................. 330/254
[58] Field of Search .................. 330/279, 254; 358/27

[56] References Cited

U.S. PATENT DOCUMENTS

| | | | |
|---|---|---|---|
| 3,473,134 | 10/1969 | Hughes | 330/17 |
| 3,970,948 | 7/1976 | Harwood et al. | 358/27 |
| 4,013,972 | 3/1977 | Nishitoba et al. | 330/254 |
| 4,051,519 | 9/1977 | Harwood | 358/28 |
| 4,173,770 | 11/1979 | Watanabe et al. | 358/28 |

FOREIGN PATENT DOCUMENTS 1035505 7/1966 United Kingdom .
1195482 6/1970 United Kingdom .

*Primary Examiner*—James B. Mullins
*Assistant Examiner*—Gene Wan
*Attorney, Agent, or Firm*—Eugene M. Whitacre; Paul J. Rasmussen; Ronald H. Kurdyla

[57] ABSTRACT

An arrangement for symmetrically gain controlling a differential amplifier is disclosed. A control circuit including first and second similarly arranged transistors coupled between points of operating potential develops first and second control voltages of prescribed magnitude at collector outputs of the transistors. The first transistor is biased to provide the first control voltage at a fixed, prescribed level related to the gain control bias requirements of the amplifier. The second control voltage varies symmetrically with respect to the first control voltage in response to the setting of a potentiometer coupled to a bias circuit of the second transistor. The potentiometer is connected directly between points of operating potential such that the control voltages are equal for a center potentiometer setting, and the second control voltage varies symmetrically with respect to the first control voltage as the potentiometer is adjusted between minimum and maximum extremes to thereby produce symmetrical amplifier gain control. Symmetrical gain control is predictable and independent of potentiometer tolerance effects and variations of the operating potentials associated with the control circuit.

10 Claims, 2 Drawing Figures

SYMMETRICALLY GAIN CONTROLLED DIFFERENTIAL AMPLIFIER

This invention concerns an arrangement for symmetrically and predictably controlling the gain of a differential amplifier, particularly when the amplifier is arranged unsymmetrically with respect to a source of operating potential for the amplifier.

A differential amplifier typically comprises first and second active devices such as transistors with input electrodes, output electrodes, and interconnected common electrodes. Operating currents for the active devices are supplied by means of a current source coupled to the interconnected common electrodes. Input signals to be amplified may be applied via the input or common electrodes, and output signals appear at the output electrodes. The gain of the differential amplifier can be controlled in response to suitable control voltages applied to the input electrodes, or to the current source for controlling the level of current conduction of the amplifier. In the case of a differential amplifier employing bipolar transistor devices, the input and output and common electrodes correspond to base, collector and emitter electrodes, and the current source often corresponds to a transistor with an appropriately biased base input and a collector-emitter path coupled between a point of operating potential and the interconnected emitter electrodes of the active amplifier devices.

One commonly used method of controlling the gain of a differential amplifier employs a potentiometer comprising a resistance coupled between first and second points of operating potential, and a wiper coupled to the base input of the current source transistor for controlling the current conduction of the current source transistor, and thereby amplifier gain, in accordance with the setting of the wiper. This gain control technique can be used only once for gain control of a given differential amplifier. A second commonly used approach employs differential bias control of the base electrodes of the amplifier devices. For this purpose, complementary phased control voltages may be used, or one of the base electrodes may be biased at a given level while the bias at the other base electrode is varied such as in response to the setting of a potentiometer or other control source.

In many signal processing systems such as a television receiver, it is advantageous for a differential amplifier to be gain controlled symmetrically. In a system employing a "stacked" or multiple level differential amplifier arrangement, provision is often required for gain controlling the amplifier arrangement in response to separate control voltages applied at different points, or levels, of the overall amplifier. In this case it is necessary to assure that the separate gain control functions do not interact adversely. These factors impose additional design constraints on such a differential amplifier arrangement, in addition to a need for predictable, symmetrical gain control operation.

The desired symmetrical gain control can be difficult to achieve predictably when one or more of the gain control voltages are derived in accordance with the setting of a potentiometer, particularly when the potentiometer is not disposed across an operating supply voltage without intervening elements. For example, in the case of the differential base biasing gain control approach mentioned above, considerations related to amplifier design and available bias voltage levels may require that the gain control potentiometer be coupled with other elements (e.g., resistors) in a voltage divider arrangement across the operating supply (e.g., +12 volts), so that a desired range of gain control voltages (e.g., 2±2 volts) can be supplied to the amplifier gain control input in accordance with the potentiometer setting. In this case, however, the desired symmetrical gain control range can be upset due to the tolerance of the potentiometer (e.g., ±20%). Tolerance effects can cause the mid-range resistance of the potentiometer to deviate from an expected value within the voltage divider including the potentiometer. Accordingly, the gain control range becomes unsymmetrical since the mechanical mid-range setting of the potentiometer then produces a control voltage which is offset from an expected mid-range value. Symmetrical gain control is therefore lost, as well as predictable operation from unit to unit.

A gain controllable differential amplifier arranged in accordance with the principles of the present invention avoids the difficulties mentioned above, and exhibits predictably symmetrical gain control operation.

In accordance with the present invention, an arrangement is provided for symmetrically controlling the gain of a differential amplifier comprising first and second active devices each with an input gain control terminal, an output terminal, and interconnected common terminals. First and second transistors are also included, each with an input electrode, and output and common electrodes defining a main current conduction path between first and second potentials. The first transistor is biased to develop a prescribed fixed voltage at the output thereof. This output voltage corresponds to a first control voltage and exhibits a prescribed level related to the gain control bias requirements of the differential amplifier. An adjustable gain control voltage divider is coupled directly between first and second operating supply potentials for providing a variable voltage in accordance with the setting thereof. The variable voltage is subject to adjustment between the first and second voltage divider operating supply potentials symmetrically with respect to a voltage developed at a mid-range setting of the adjustable voltage divider. The variable voltage from the adjustable voltage divider is coupled to the input of the second transistor such that the second transistor is biased to develop an output voltage, corresponding to a second control voltage, substantially equal to the prescribed first control voltage when the adjustable voltage divider is adjusted to a mid-range setting. The second transistor is also biased by the variable voltage such that the second control voltage varies symmetrically with respect to the first control voltage over a range less than the difference between the first and second operating supply potentials coupled to the adjustable voltage divider as the voltage divider is adjusted between minimum and maximum settings. The first and second control voltages are respectively coupled to the input control terminals of the amplifier.

In accordance with a feature of the invention, the gain controlled differential amplifier is included in a multiple level amplifier arrangement including plural differentially arranged stages.

Figure 2:
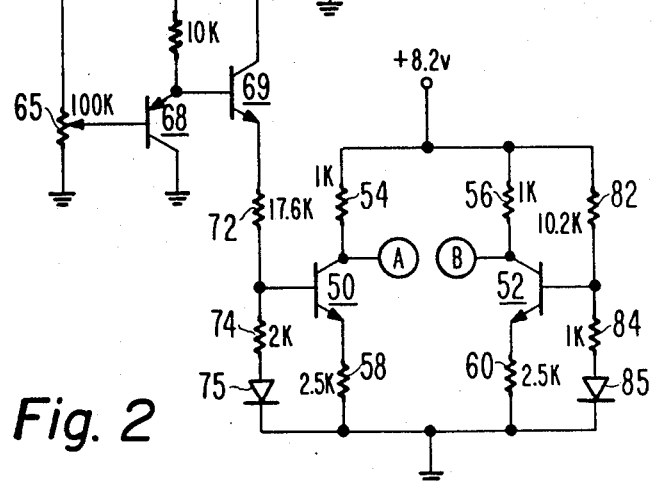

In the drawing:

FIG. 1 illustrates a portion of a color television receiver partly in block diagram form and partly in schematic circuit diagram form, including a differential amplifier biased for symmetrical gain control; and FIG. 2 shows a circuit for providing gain control bias voltages to the amplifier of FIG. 1 to achieve symmetrical gain control operation.

In FIG. 1, there is shown a multiple level differential amplifier arrangement 10 including three vertically stacked differential amplifiers in a chrominance signal processing channel of a color television receiver.

Complementary phase chrominance signals are supplied from outputs of a source of chrominance signals 12 to respective base inputs of a first level differential amplifier comprising emitter coupled transistors 14 and 15. Amplified chrominance signals appearing at a collector output of transistor 14 are applied to the joined emitter electrodes of transistors 16 and 17, which form a second level differential signal control stage. Further amplifier chrominance signals appearing at a collector output of transistor 17 are applied to the joined emitter electrodes of transistors 18 and 19, which form a third level differential amplifier control stage together with transistors 20 and 21. Finally amplifier chrominance signals appear across a load impedance 25 in the collector output circuit of transistor 19. These signals are further processed by a chrominance processing unit 28 for ultimately developing color image representative signals together with the luminance component of the television signal as provided from a luminance signal processing unit 30. Operating currents for circuit 10 are provided by a current source including a transistor 32.

The described multiple level differential amplifier arrangement 10 is advantageous in an integrated circuit environment, since it uses integrated circuit chip area efficiently. At the same time, however, this arrangement imposes design constraints with respect to several factors, notably amplifier biasing and gain control operation particularly with respect to achieving symmetrical gain control in predictable fashion.

Amplifier circuit 10 is gain controlled in response to three independently derived gain control voltages.

Overall gain control of amplifier 10 is accomplished in response to a control voltage derived from a control network 35 including a viewer adjustable potentiometer 36 and transistors 37 and 38. A control voltage developed at a wiper of potentiometer 36 in accordance with the setting of potentiometer 36 is coupled via transistor 38 to a base input of current source transistors 32. Adjusting the setting of potentiometer 36 serves to vary the current conduction level of transistor 32, and thereby the gain of the first, second and third level amplifiers and the amplitude of signals processed thereby. In this example, potentiometer 36 serves as both a chrominance saturation control (as described), and a luminance contrast control. For the latter purpose, the control voltage from network 35 is also applied to a gain control input of luminance processor 30. Accordingly, adjustment of potentiometer 36 serves to simultaneously control the amplitudes of the chrominance and luminance signals so that a desired amplitude relationship is maintained between the chrominance and luminance signals.

It is noted that potentiometer 36 is connected directly between the first and second points of operating potential (i.e., +11.2 volts and ground) without intervening elements. The mid-range setting of potentiometer 36 corresponds to an amplifier gain midway between minimum and maximum gain control extremes within a desired control range, whereby symmetrical gain control is achieved as control 36 is varied between minimum and maximum settings. This result is not altered by unit-to-unit tolerance variations in the resistance value of potentiometer 36, or by variations in the voltage impressed across potentiometer 36, since symmetrical gain control voltage will be produced as the setting of potentiometer 36 is varied about the mechanical center position.

The second and third level differential amplifiers 16, 17 and 18, 19 are additionally gain controlled in response to a differential gain control voltage applied to the base electrodes of transistors 16 and 17, independent of the control voltage from network 35. This gain control mechanism, as well as the required levels of gain control voltage, differ from that of amplifier 14, 15 and network 35 due to circuit design constraints imposed with respect to signal and bias levels for the second and third level amplifiers.

For the purpose of achieving the desired gain control of amplifiers 16 and 17, the base of transistor 16 is biased at a +6.3 volt level (approximately equal to one-half of the +11.2 volt operating supply) as derived from a terminal $T_1$ of a network 40, and a bias resistor 42 interconnects the base electrodes of transistors 16 and 17. Network 40 comprises a voltage divider network arranged as shown between first and second points of operating potential (+11.2 volts and ground), for the purpose of providing a required base bias level of +6.3 volts for amplifier 16, 17. A bias voltage of +8.2 volts is developed at a terminal $T_2$ of network 40, for use with a circuit as will be discussed in connection with FIG. 2. The bias voltages supplied from network 40 are provided in accordance with the mutual ratios of the values of the series voltage divider resistors included in network 40.

In this example, amplifier 16, 17 is gain controlled in response to a voltage applied to the base of transistor 17 from an output of an overload and color killer control unit 45. Control unit 45 is of conventional design and responds to the level of the chrominance signals (e.g., from unit 12) for controlling the amplitude of chrominance output signals from circuit 10 under conditions of excessively high level chrominance signals (in the overload control mode) and excessively weak chrominance signals (in the color killer mode). For this purpose, the control signal from unit 45 varies the base bias of transistor 17 with respect to the base bias of transistor 16, to thereby vary the gain of amplifier 16, 17.

It is noted that a nominal symmetrical control range of amplifier 16, 17 in response to control signals from unit 45 can be upset by circuit tolerances and other effects which alter the operating parameters of circuits within unit 45, and by variations in the operating parameters of voltage divider 40 (e.g., which can cause the +6.3 volt reference level to shift). Unlike the gain control provided by network 35, however, symmetrical gain control of amplifier 16, 17 in response to the operation of unit 45 is not critical to effective circuit operation, due to the nature of the control function provided by unit 45 in this example. Therefore, the described gain control bias voltages for amplifier 16, 17 are acceptable even though unsymmetrical gain control operation is likely to occur. However, the gain control requirements for third level amplifier 18, 19 are more critical.

For the purpose of desired gain control operation, differential amplifier 18, 19 is unsymmetrically disposed in circuit 10 with respect to the first and second operating potentials of +11.2 volts and ground. Specifically, in this embodiment it is desired to gain control amplifier 18, 19 so that the amplitude of output signals developed across load impedance 25 varies over a three volt range from +8.2 volts to +11.2 volts. This requires that the gain control bias voltages applied to the control inputs of amplifier 18 and 19 via terminals A and B be on the order of +8 volts, as will be discussed (e.g., rather than on the order of +5.6 volts, corresponding to the middle of the +11.2 volt operating potential).

Gain control of amplifier 18, 19 corresponds to a means of providing (saturation) control of the chrominance signals independent of the gain control mechanisms already discussed. Such control is provided by means of a viewer operated control, thereby requiring a symmetrical gain control response since, like the gain control provided by network 35, any deviations from symmetrical color amplitude control will be readily perceived by a viewer and considered objectionable.

As a result of this consideration, and due to the location of amplifier 18, 19 within circuit 10 and the associated gain control bias constraints, conventional differential amplifier gain control techniques such as described with respect to first and second level amplifiers 14, 15 and 16, 17, are considered inappropriate for the purpose of symmetrically gain controlling amplifier 18, 19 in a predictable manner.

Amplifier 18, 19 is gain controlled in response to differential control voltages applied to the base electrodes of transistors 18 and 19 via terminals A and B. These control voltages are developed by the circuit arrangement shown in FIG. 2.

Referring now to FIG. 2, there is shown a circuit including first and second similar transistors 50 and 52. Equal value resistors 54 and 56 respectively couple the collector electrodes of transistors 50 and 52 to a first operating supply potential (+8.2 volts), and equal value resistors 58 and 60 respectively couple the emitter electrodes of transistors 50 and 52 to a second operating supply potential (ground).

A viewer adjusted color saturation control potentiometer 65 is directly connected between +11.2 volts and zero volts (ground) operating potentials without intervening elements. A variable voltage developed at a wiper of control 65 supplies base bias for transistor 50 by means of a network comprising a PNP transistor 68, an NPN transistor 69, voltage divider resistors 72, 74 and a compensation diode 75. Coupling transistors 68 and 69 are arranged in a "zero offset" configuration whereby the emitter voltage of transistor 69 equals the base voltage of transistor 68. Base bias for transistor 52 is provided by means of a network comprising voltage divider resistors 82, 84 and a compensation diode 85, coupled between operating supply potentials of +8.2 volts and zero volts (ground). Diodes 75 and 85 compensate for the base-emitter junction offset voltage of transistors 50 and 52, respectively. The ratio of resistors 82 and 84 together with the offset voltage of diode 85 establishes a +1.2 volt base bias voltage for transistor 52. A similar bias voltage is developed at the base of transistor 50 by the ratio of resistors 72 and 74 together with the offset voltage of diode 75 for a center setting of potentiometer 65. Output gain control voltages developed at the collector electrodes of transistors 50 and 52 are coupled via terminals A and B to differential amplifier 18, 19 (FIG. 1).

Gain control voltages developed at terminals A and B are not arbitrary, but are dictated by the design of amplifier circuit 10 in FIG. 1. In this embodiment, a control voltage range of +8.0±0.2 volts at terminals A and B is sufficient to provide the desired three volt amplitude variation of signals developed across amplifier load impedance 25, from 8.2 to 11.2 volts as mentioned in connection with FIG. 1. The latter design consideration establishes the fixed voltage of +8.0 volts that should be developed at the collector of transistor 52 and at terminal B, and also determines the level of the +8.2 volt operating supply voltage for the circuit including transistors 50 and 52. Transistor 52 is biased to develop a voltage drop of +0.2 volts across collector resistor 56. The magnitude of this voltage drop corresponds to the magnitude of the desired ±0.2 volt control range variations of the differential control voltage developed between terminals A and B as control 65 is adjusted from the center position to the extreme position.

The gain control voltages developed at terminals A and B are equal (+8.0 volts) when potentiometer 65 is set at a mid-range position, whereby the differential voltage between these terminals is zero. Transistors 50 and 52 conduct equal currents at this time. The differential voltage between terminals A and B varies between +0.2 volts and −0.2 volts as control 65 is varied between its extreme settings. Specifically, the voltage at terminal A decreases by −0.2 volts to +7.8 volts when control 65 is set at the extreme upper (minimum gain) position, and the voltage at point A increases by +0.2 volts to +8.2 volts when control 65 is set to the extreme lower (maximum gain) position. The ±0.2 volt control voltage variation is sufficient to produce appropriate variations in the current conduction levels of transistors 18 and 19, thereby establishing the desired amplitude control range of signals processed by amplifier 18, 19.

It is noted that the differential control voltage developed between terminals A and B, and thereby the gain of amplifier 18, 19 in FIG. 1, vary symmetrically as control 65 is adjusted between maximum and minimum settings. This result is produced even if the operating supply voltage across potentiometer 65 changes, or if the resistance value of potentiometer 65 varies from unit to unit due to tolerance effects. The mechanical center setting of control 65 will correspond to the center of the gain control range about which symmetrical gain control is produced for minimum and maximum control settings.

Variations in the value of voltage divider resistors 72 and 74 do not upset the symmetrical control, since the symmetrical control voltage from the wiper of control 65 as translated without offset by transistors 68 and 69 remains symmetrical in form at the base of transistor 50. The arrangement of FIG. 2 is particularly advantageous in an integrated circuit environment, since the ratios of resistors 72 and 74, 82 and 84, 54 and 58, and 56 and 60 can be established accurately. These ratios will remain substantially constant even though the absolute values of the associated resistors vary with temperature changes, for example. Also, in such an environment variations in the operating parameters of the circuit including these resistors and transistors 50, 52 (e.g., due to temperature effects) track with each other to maintain symmetrical operation. It is also noted that the magnitude of the control voltages developed at terminals A and B can readily be tailored (i.e., scaled from an available operating supply voltage) to suit the gain control bias requirements of a given system simply by suitably altering the resistor ratios mentioned previously. This can be accomplished with a high degree of accuracy in an integrated circuit environment.

What is claimed is:

1. An arrangement for symmetrically gain controlling a differential amplifier comprising first and second active devices each with an input gain control terminal, an output terminal, and interconnected common terminals, said arrangement comprising:
   a first transistor with in input electrode, and output and common electrodes defining a main current conduction path of said first transistor coupled between first and second potentials;
   means for biasing said first transistor to conduct a fixed current and to develop an associated prescribed fixed voltage at said output of said first transistor, said output voltage corresponding to a first control voltage and exhibiting a prescribed level related to the gain control bias requirements of said amplifier;
   a second transistor with an input electrode, and output and common electrodes defining a main current conduction path of said second transistor coupled between first and second potentials;
   adjustable voltage divider means coupled directly between first and second operating supply potentials for providing a variable voltage in accordance with the setting of said adjustable voltage divider means, said voltage being subject to adjustment between said first and second operating supply potentials symmetrically with respect to a voltage developed at a mid-range setting of said adjustable voltage divider means as said voltage divider means is adjusted between minimum and maximum settings;
   means for coupling said variable voltage from said adjustable voltage divider means to said input of said second transistor such that said second transistor is biased to conduct a variable current in response to said variable voltage independent of said fixed current of said first transistor and to develop an associated variable output voltage, corresponding to a second control voltage, substantially equal to said prescribed first control voltage when said adjustable voltage divider means is adjusted to a mid-range setting, and such that said second control voltage varies symmetrically with respect to said first control voltage over a range less than the difference between said first and second operating supply potentials as said adjustable voltage divider means is adjusted between minimum and maximum settings; and
   means for coupling said first and second control voltages to respective input control terminals of said amplifier.

2. An arrangement according to claim 1, wherein:
   said adjustable voltage divider means comprises a potentiometer with a first terminal directly connected to a first operating potential, a second terminal directly connected to a second operating potential, and an adjustable tap at which said variable voltage is provided; and
   said means for coupling said variable voltage to said second transistor comprises a first voltage divider, said input of said second transistor being coupled to a point in said first voltage divider for receiving a translated version of said variable voltage.

3. An arrangement according to claim 2, wherein:
   said variable voltage is applied to said voltage divider with zero voltage offset.

4. An arrangement according to claim 2, wherein:
   said biasing means comprises a second voltage divider, said input of said first transistor being coupled to a point in said second voltage divider such that said input of said first transistor is biased at a voltage substantially equal to a bias voltage developed at said input of said second transistor when said adjustable voltage divider means is at a mid-range setting.

5. An arrangement for symmetrically gain controlling a differential amplifier comprising first and second active devices each with an input gain control terminal, an output terminal, and interconnected common terminals, said arrangement comprising:
   an adjustable voltage divider connected directly between first and second operating supply potentials for providing a variable voltage in accordance with the setting of said adjustable voltage divider, said voltage being subject to adjustment between said first and second potentials symmetrically with respect to a voltage developed at a mid-range setting of said adjustable voltage divider as said voltage divider is adjusted between minimum and maximum settings;
   a first transistor with an input electrode, an output electrode coupled to an operating potential via a first resistance, and a common electrode;
   a second transistor with an input electrode, an output electrode coupled to an operating potential via a second resistance, and a common electrode;
   a first voltage divider network coupled between first and second potentials, said input of said first transistor being biased from a point in said first voltage divider so that said first transistor conducts a fixed current and develops a corresponding prescribed fixed voltage at said output of said first transistor;
   a second voltage divider coupled between said adjustable voltage divider and a point of operating potential, said input of said second transistor being coupled to a point in said second voltage divider to receive a translated version of said variable voltage for biasing said input of said second transistor at a voltage substantially equal to said input bias of said first transistor when said adjustable voltage divider is at a mid-range setting, and for biasing said second transistor to conduct a variable current in response to said variable voltage independent of said fixed current of said first transistor and to develop a corresponding variable output voltage such that the voltage at said output of said second transistor varies symmetrically with respect to said voltage at said output of said first transistor as said adjustable voltage divider is adjusted between minimum and maximum settings; and
   means for coupling said output voltages from said first and second transistors to said control inputs of said amplifier, respectively.

6. An arrangement according to claim 5, and further comprising:
   third and fourth resistances for respectively coupling said common electrodes of said first and second transistors to a point of operating potential.

7. An arrangement according to claim 6, wherein:
   said first and second transistors are similar;
   said first and second resistances are substantially equal in value; and
   said third and fourth resistances are substantially equal in value.

8. An arrangement according to claim 7, wherein:

said input, output and common electrodes of said first and second transistors respectively correspond to base, collector and emitter electrodes.

9. A gain controlled differential amplifier arrangement comprising:
- a first differential amplifier comprising first and second transistors each having an input electrode, an output electrode, and interconnected common electrodes, said first amplifier being responsive to signals applied to an input electrode for providing an amplified signal at said output electrode of said first transistor;
- a second differential amplifier comprising third and fourth transistors each having an input electrode, an output electrode, and interconnected common electrodes, said second amplifier being responsive to amplified signals applied to said interconnected common electrodes of said second amplifier from said output of said first transistor for providing a further amplified signal at said output electrode of said third transistor;
- a load impedance coupled to said output electrode of said third transistor;
- a current source for supplying operating currents for said first and second amplifiers via said common electrodes of said first amplifier;
- a fifth transistor with an input electrode, and output and common electrodes defining a main current conduction path of said fifth transistor coupled between first and second potentials;
- means for biasing said fifth transistor to develop a prescribed fixed voltage at said output of said fifth transistor, said output voltage corresponding to a first gain control voltage and exhibiting a prescribed level related to the gain control bias requirements of said second differential amplifier;
- a sixth transistor with an input electrode, and output and common electrodes defining a main current conduction path of said sixth transistor coupled between first and second potentials;
- an adjustable gain control voltage divider coupled directly between first and second operating supply potentials for providing a variable gain control voltage in accordance with the setting of said adjustable voltage divider, said gain control voltage being subject to symmetrical adjustment between said first and second operating supply potentials with respect to a voltage developed at a mid-range setting of said adjustable voltage divider as said adjustable voltage divider is adjusted between minimum and maximum settings;
- a network for coupling said variable voltage from said adjustable voltage divider to said input of such sixth transistor such that said sixth transistor is biased to develop an output voltage, corresponding to a second gain control voltage, substantially equal to said prescribed first gain control voltage when said adjustable voltage divider is adjusted to a mid-range setting, and such that said second gain control voltage varies symmetrically with respect to said first gain control voltage over a range less than the difference between said first and second operating supply potentials as said adjustable voltage divider is adjusted between minimum and maximum settings; and
- means for respectively coupling said first and second gain control voltage to said input electrodes of said second differential amplifier.

10. An arrangement according to claim 9, wherein:
said current source comprises a controllable conduction device, and wherein said arrangement further comprises
- a source of variable gain control voltage coupled to said controllable conduction device for controlling the magnitude of currents provided to said amplifier arrangement to thereby control the signal gain of said differential amplifier arrangement.

* * * * *